United States Patent [19]

Rosenstein et al.

[11] Patent Number: 4,922,184
[45] Date of Patent: May 1, 1990

[54] APPARATUS AND PROCESS FOR THE SIMULTANEOUS CONTINUITY SENSING OF MULTIPLE CIRCUITS

[75] Inventors: Leo M. Rosenstein, Lakeville; Glenn J. Gulbranson, Burnsville, both of Minn.

[73] Assignee: Control Data Corporation, Minneapolis, Minn.

[21] Appl. No.: 237,438

[22] Filed: Aug. 29, 1988

[51] Int. Cl.[5] .................... G01R 19/00; G01R 19/165
[52] U.S. Cl. ............................. 324/72.5; 324/140 R; 324/158 F; 324/158 R
[58] Field of Search ............. 324/158 F, 158 R, 72.5, 324/140 R, 133; 330/284; 307/445, 360, 464

[56] References Cited

U.S. PATENT DOCUMENTS

| | | |
|---|---|---|
| 3,783,372 | 1/1974 | Boyd . |
| 3,792,349 | 2/1974 | Bobbitt . |
| 4,011,507 | 3/1977 | Rossell ............................ 324/140 R |
| 4,115,731 | 9/1978 | Axtell, III . |
| 4,211,915 | 7/1980 | Miller et al. ....................... 324/73 R |
| 4,333,177 | 6/1982 | Sutterlin ........................... 324/73 R |
| 4,471,298 | 9/1984 | Frohlich . |
| 4,527,076 | 7/1985 | Matsuo et al. . |
| 4,661,772 | 4/1987 | Kirstein .......................... 324/73 PC |
| 4,697,142 | 9/1987 | Frushour . |

FOREIGN PATENT DOCUMENTS

| | | |
|---|---|---|
| 0072357 | 6/1981 | Japan ................................... 324/537 |
| 0090270 | 7/1981 | Japan ................................... 371/25 |

OTHER PUBLICATIONS

"Dynamic Burn-In System", by Belyeu et al, IBM Tech. Disc. Bull., vol. 22, #8A, 1/80, pp. 3065-3068.
"Programmable Strobe", by Wireless World, 3/78.

*Primary Examiner*—Reinhard J. Eisenzopf
*Assistant Examiner*—W. Burns
*Attorney, Agent, or Firm*—Frederick W. Niebuhr; Robert M. Angus; Edward P. Heller, III

[57] ABSTRACT

An apparatus for simultaneously testing multiple integrated circuits includes a sensing circuit associated with each of the tested circuits. Each sensing circuit includes a differential amplifier with its positive input connected to the input of the test circuit, and its inversion input connected to the test circuit output. The test circuit input and positive amplifier input are biased to a selected voltage, and the voltage drop across the test circuit is provided to the amplifier inversion input. Whenever the test circuit is open, intermittently open or highly resistive, the voltage drop across the test circuit exceeds the threshold voltage of the differential amplifier, causing the amplifier to generate a high level logic output representing an open circuit condition. The outputs of the various sensing circuits together form a digital word representative of the condition of all of the test circuits. The outputs of the differential amplifiers also are provided to independent triggering circuitry for enabling the storage of sensing circuit outputs upon an open condition indicated for at least one of the test circuits. The outputs of the sampling circuits are sampled in parallel at 100 nanosecond or longer selected intervals, so that extremely brief intermittent opens are detected.

20 Claims, 2 Drawing Sheets

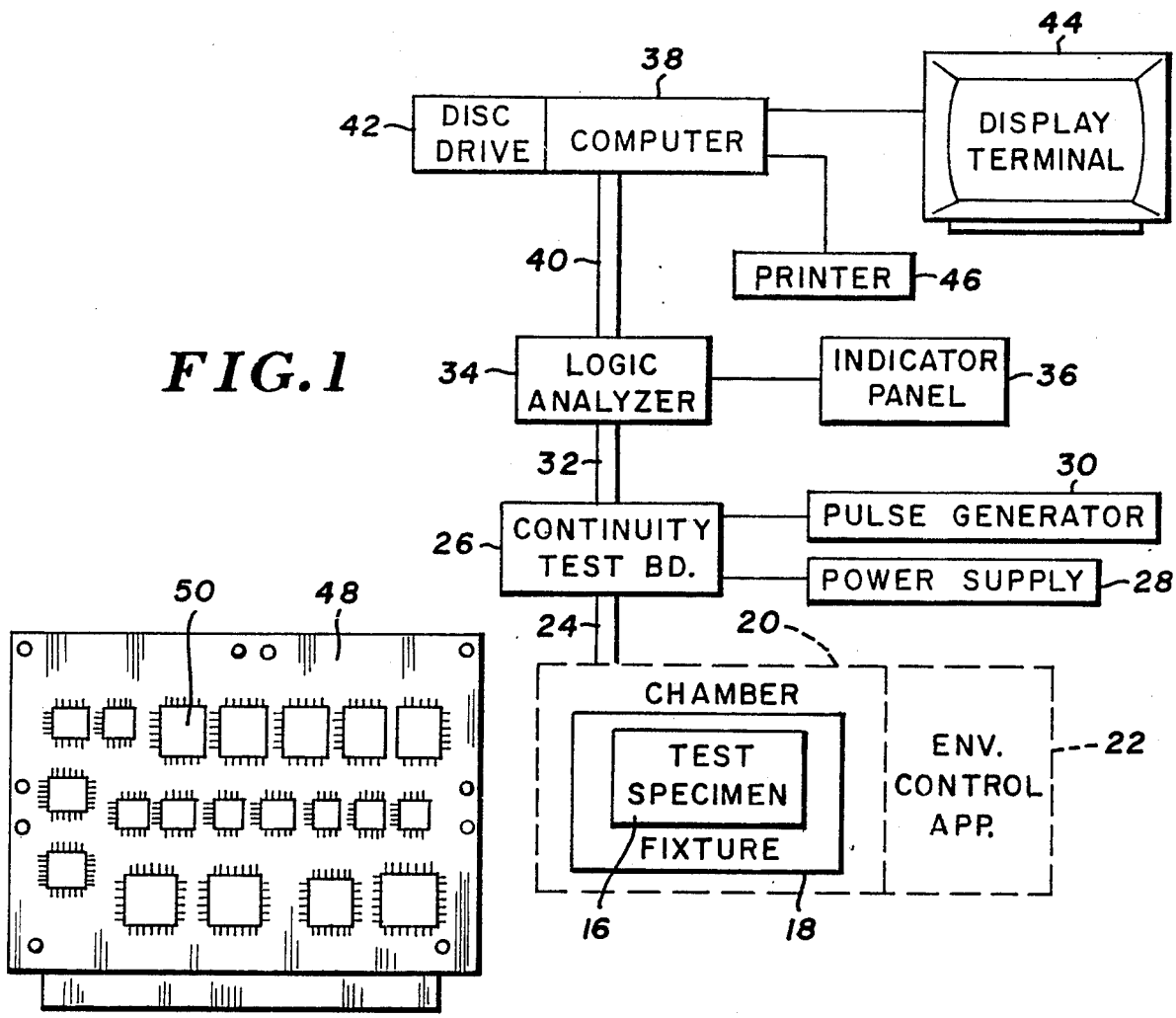
*FIG.1*
*FIG.2*
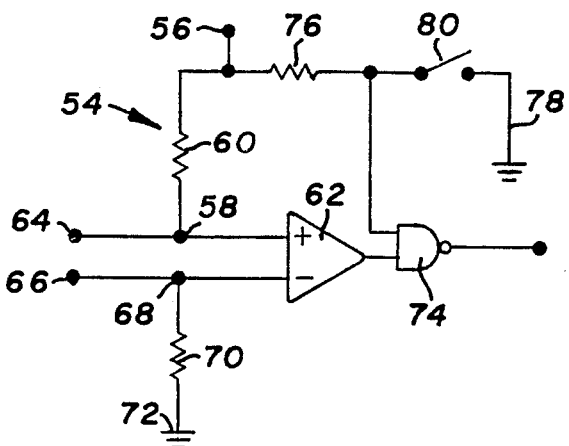
*FIG.3*
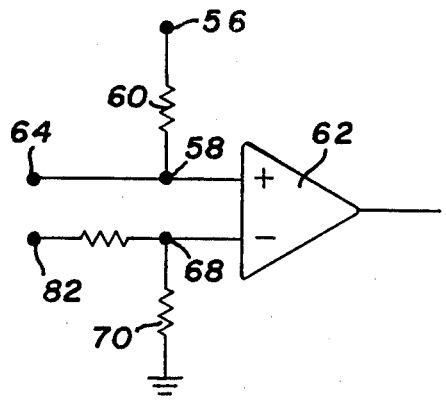
*FIG.4*

APPARATUS AND PROCESS FOR THE SIMULTANEOUS CONTINUITY SENSING OF MULTIPLE CIRCUITS

BACKGROUND OF THE INVENTION

This invention relates to the testing of electrical circuits, and more particularly to a means for simultaneously testing a multiplicity of circuits for an open, intermittent open or high resistance condition as they are subjected to temperature cycling, vibration, or other demanding environmental conditions.

Integrated circuits, first developed for use in computing equipment, have since been employed in a wide variety of products not previously associated with data processing or computing, for example in automobiles and household appliances. This widespread usage springs from some substantial advantages afforded by integrated circuits as compared to prior electrical circuitry, e.g. smaller size, lower cost and increased reliability. However, as the demand continues for increasingly complex integrated circuits formed on ever smaller semiconductor chips, a corresponding need arises for equipment and processes to test the circuitry to ensure its reliability.

Arrangements for testing integrated circuits are known in the art. For example, U.S. Pat. No. 3,783,372 (Boyd) discloses a high gain operational amplifier for a hand-held testing device, which generates a relatively low reference output current when its input is connected to an open circuit, but generates a substantially higher amperage output when connected to a short circuit. U.S. Pat. No. 3,792,349 (Bobbitt) discloses a network for detecting circuit discontinuities utilizing either steady-state voltages or pulses, having both positive and negative potentials. Upper and lower channels of the device each employ relays in connection with a diode gate, a biased amplifier, a comparator and a pair of NAND gates.

A sequential tester for finding electrical shorts is disclosed in U.S. Pat. No. 4,115,731 (Axtell). In the course of testing, a user touches two probes of the test apparatus to the conductive strips of a printed circuit board. When both probes are on the path of the short circuit, the probe assembly indicates this to the operator. A mechanical approach to parallel testing of multiple circuits is shown in U.S. Pat. No. 4,471,298 (Frohlich). Two parallel bars, each with set of probe contacts, are movable relative to a printed circuit board in the direction perpendicular to their extension. Test voltages are sequentially applied to selected pairs of probe contacts.

While such approaches are satisfactory in many respects, they fail to address the needs of integrated circuits fabricated for use in certain particularly demanding environments, for example aviation, space exploration and certain military applications, where circuitry can be highly complex, yet reliability of each circuit is paramount. Such circuits often are subjected to stressful environmental conditions, for example extreme temperature cycling or vibration. Any system for testing such circuitry must involve a reasonable approximation of the environmental conditions or stress anticipated during use, and be capable of detecting not only permanently open circuits, but also circuits which are intermittently open, or circuits which, while not totally open, experience an unacceptable increase in resistance or impedance, whether permanently or intermittently.

Sequential testing equipment, even if automated, cannot meet these standards, as the time any given circuit is under test often is less than the time it is not by an order of magnitude or more. Intermittent unacceptable conditions can be completely overlooked by such a testing system.

Therefore, it is an object of the present invention to provide a system for the simultaneous or parallel testing of multiple circuits in an integrated circuit configuration, such as a single semiconductor chip or an assembly of integrated circuit packages connected to a printed circuit board.

Another object of the invention is to provide a means for identifying intermittent open conditions in tested circuitry, or intermittent conditions of unacceptably high resistance in a given circuit.

Another object is to provide a simple, low cost testing apparatus for rapidly identifying and displaying open or otherwise unacceptable conditions for one or more of a multiplicity of circuits.

Yet another object is to provide a system for parallel testing of integrated circuit packages and their multiple terminations to a printed circuit board, in which the recording of test results is triggered by a sensed error condition in one or more of the circuits.

SUMMARY OF THE INVENTION

To achieve these and other objects, there is provided an apparatus for simultaneously testing a plurality of electrical circuits in a circuit configuration to identify an error condition with respect to one or more of the tested circuits. The apparatus includes a plurality of sensing circuits, each sensing circuit associated with one of a plurality of test circuits. Each test circuit includes a test circuit input and a test circuit output. Each sensing circuit includes a comparator means having first and second comparator inputs and a predetermined voltage threshold between the first and second inputs. Each sensing circuit has an input voltage means for providing a first voltage level to the first comparator input and to the test circuit input of the associated test circuit. An output voltage means is connected to the test circuit output of each test circuit and to the second comparator input of the associated comparator means for providing a second voltage level to the second comparator input corresponding to the voltage at the test circuit output. Each sensing circuit further includes a low voltage terminal, and a sensing output resistor connected to the low voltage terminal and to the output voltage means. The sensing output resistor has a resistance substantially greater than a nominal or expected resistance of the associated test circuit. Each of the comparator means generates a comparator output comprising first and second alternative logic states. The first logic state is generated whenever the first voltage exceeds the second voltage by at least the voltage threshold. The second state is generated whenever the first voltage does not exceed the second voltage by at least the predetermined threshold. One of the first and second logic states indicates a normal condition with respect to the associated test circuit, while the other state indicates an error condition. Thus, the comparator means together generate a digital word that represents the conditions of the test circuits. The apparatus further includes a sensing means for simultaneously sensing many comparator outputs simultaneously, and a control means for generating a storage command signal responsive to sensing an error condition at any of the comparator outputs. Finally, a storage means is provided and includes a plurality of channels, one associated with each sensing circuit. The storage means stores the comparator outputs responsive to receiving the storage command signal generated by the control means.

Preferably, the apparatus has an indicator means for generating a user recognizable signal responsive to the generation of the storage command signal. A light emitting diode has been found satisfactory for this purpose. Further, the apparatus can have a video display terminal and/or a printer for providing the comparator outputs in readable form.

In the specific application of testing for open circuits, the logic output of each comparator means that is generated as a result of a hiqhly resistive or open circuit is selected as the error condition logic state. Accordingly, an integrated circuit configuration in which all of the circuits are closed or shorted as desired will generate no logic state representative of an error condition.

In testing for intermittent error conditions, pulses for sensing the comparator outputs can be generated at extremely short intervals, for example one hundred nanoseconds. Triggering circuitry, separate from the sensing circuitry, is utilized to activate the storage means only if an error condition is sensed, to substantially reduce the required storage capacity. Thus, circuit failures of short duration, which can escape a detection altogether in a sequential test, are sensed and recorded.

In principle, the testing apparatus positions a test circuit in parallel with two inputs of a comparator means, preferably a differential amplifier with a known voltage threshold between its two inputs. A properly conducting test circuit yields a relatively small voltage differential provided to the inputs, while an unacceptably resistive or open circuit provides a much higher voltage differential, causing the amplifier to fire or generate the error condition logic state as its output. Input and output resistances to the parallel arrangement, along with the voltage threshold, can be configured to provide for clear differentiation between open and closed circuits to provide a digital response unaffected by slight variances in the involved resistances or threshold. Thus, highly reliable and rapid test results are obtained.

IN THE DRAWINGS

The above and other feature and advantages are better understood upon consideration of the following detailed description of the preferred embodiments, in connection with the drawings, in which:

FIG. 1 is a diagrammatical view of an integrated circuit testing system constructed in accordance with the present invention;

FIG. 2 is a top plan view of a typical test circuit configuration including an assembly of integrated circuit packages on a printed circuit board;

FIG. 3 is a schematic representation of a sensing circuit employed in the testing apparatus;

FIG. 4 is a schematic representation of a modification of the sensing circuit of FIG. 3 for increasing sensitivity;

DETAILED DESCRIPTION OF THE PREFERRED EMBODIMENTS

Figure 5:
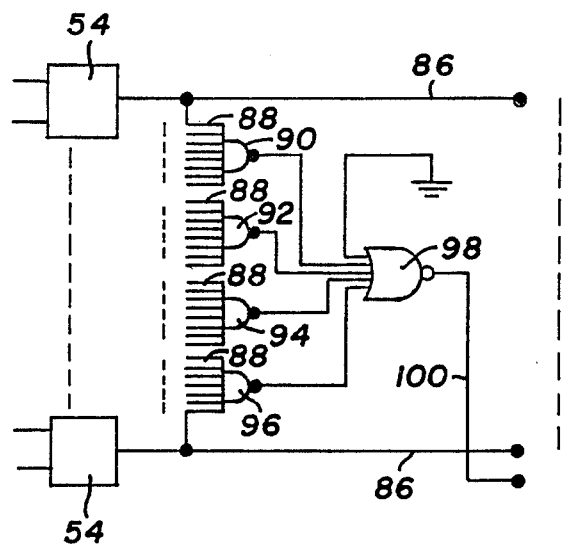
FIG. 5 is a schematic representation of further circuitry of the testing apparatus.

Turning now to the drawings, there is shown in FIG. 1 an integrated circuit continuity testing system in which a specimen or circuit configuration 16 is mounted on a fixture 18 operable to vibrate the specimen under controlled conditions, e.g. sinusoidally, randomly, or a combination of the two. The specific structure of the fixture and the means for vibrating it are known in the art and thus not further discussed. The specimen and fixture are housed in a closed chamber 20 whereby the specimen under test can be subjected to temperature cycling, either alone or in conjunction with the vibration testing. An environmental control apparatus, indicated at 22, is provided for selectively heating or cooling the chamber interior.

A cable 24 electrically connects fixture 18, and thus specimen 16, with a continuity testing board 26. It is to be understood that cable 24 includes a multiplicity of separate electrical connections between fixture 18 and testing board 26, the details of which are discussed in connection with FIGS. 6 and 7. In general, however, continuity testing board 26 includes a plurality of identical sensing circuits, each of which is electrically connected to one of the test circuits of specimen 16 during continuity testing. A power supply 28 biases each of the sensing circuits to a predetermined positive voltage, for example five volts. A pulse generator 30 is provided to control the timing or frequency of samples in the course of testing.

A cable 32 connects continuity testing board 26 with a logic analyzer 34. Again, a multiplicity of separate electrical connections are involved, in this case between each of the sensing circuits on continuity testing board 26 and one of many data storage channels in logic analyzer 34. Further electrical connections between logic analyzer 34 and continuity testing board 26 include a plurality of triggering channels provided to initiate storage of data by the logic analyzer upon recognition of an error condition during testing, and a connection for interaction with pulse generator 30. An indicator 36 also is electrically connected to logic analyzer 34. Panel 36 includes a plurality of light emitting diodes for providing certain indications to a user of the test system.

A computer 38 is connected to logic analyzer 34 through a cable connection 40. Computer 38 contains the software which controls logic analyzer 34 in its acquisition and storage of test data and, if desired, can include an associated disc drive or other memory, as indicated at 42, for the storage of data to supplement the logic analyzer. Further peripheral equipment is connected to the computer and used in the course of testing, including a video display terminal 44 for providing the operator with a visual indication of test results on-line, and a printer 46 for generating a permanent record of the test results.

FIG. 2 discloses test specimen 16 in greater detail. While the present invention contemplates testing most any configuration involving a multiplicity of individual circuits, the present test system is particularly well adapted for detecting open circuits in an assembly of semiconductor packages mounted to a printed circuit board, such as printed circuit board 48 to which is mounted a plurality of chip carriers 50. Other multiple circuit devices could be tested as well, e.g. flat packs and dual in-line packages (DIP). It is known as well to mount semiconductor chips directly to a printed circuit board, and it can be appreciated that individual semiconductor chips or chip carriers of a particularly complex design might be tested individually.

Parallel or simultaneous testing is accomplished by providing multiple, substantially identical sensing circuits on continuity testing board 26. One such sensing circuit is indicated at 54 in FIG. 3, and includes a differential amplifier 62 and a NAND gate 74 available from Fairchild as part of a Model 9622 receiver. Each sensing circuit further includes a high voltage terminal 56 connected to power supply 28 such that it is biased to a predetermined high voltage, e.g. +5 volts. High voltage terminal 56 is connected to a common terminal or node 58 through an input resistor 60. Node 58 provides a voltage level, in this case a positive voltage of less than 5, to the positive input terminal of differential amplifier 62, and also to a terminal 64 connected to the input of the circuit under test.

The output voltage of the circuit under test is provided to a terminal 66 of the sensing circuit, whereby the output voltage is provided through a common terminal or node 68 to the inversion input of differential amplifier 62 (preferably with good common mode rejection), and also to ground through an output resistor 70. It should be noted that the terms "input" and "output" for resistors 60 and 70 are used for convenience. These resistors can, as well, be considered as connected to the outputs of the test circuit and providing the inputs to amplifier 62.

In effect, input resistor 60, output resistor 70 and the arrangement of the circuit under test and differential amplifier 62 in parallel are combined to provide three resistances in series between high voltage terminal 56 and a low voltage terminal 72, i.e. ground. The sensing of open or unacceptably resistive test circuits is based upon the difference in voltage at the positive and inversion terminals of the differential amplifier. The differential amplifier is a known logic or digital device which generates one of two alternative logic states: a "high" state or higher voltage output whenever the voltage at the positive terminal exceeds the voltage at the inversion terminal by a characteristic or predetermined threshold; and a low logical output of voltage whenever the voltage at the positive input does not exceed the voltage at the inversion input by the threshold. Differential amplifier 62 is selected for its predetermined threshold voltage level, e.g. approximately 1.5 volts.

An open or unacceptably resistive test circuit is detected as follows. Amplifier 62 is a high resistance or impedance device, such that the resistance of its parallel arrangement with the test circuit essentially equals the resistance of the test circuit itself, a nominal or expected resistance of about 2 ohms. Input and output resistors 60 and 70 have a substantially greater resistance, for example 100 ohms each. Consequently the voltage drop across the test circuit, i.e. across the comparator inputs, is quite small compared to the voltage drop across each of the resistors, for example less than 0.1 volts. Thus, when the test circuit provides a short or closed path, the drop in voltage between the comparator inputs is much smaller than the 1.5 volt threshold and differential amplifier 62 generates the low logic state.

Conversely, when the test circuit is open the resistance of the parallel arrangement is many times that of resistors 60 and 70, to the point where the voltage difference between the comparator inputs exceeds the threshold voltage and causes amplifier 62 to generate the high logic state.

Amplifier 62 also generates the high logic state when the resistance of the circuit being tested is higher than an acceptable maximum corresponding to the predetermined voltage threshold. In particular, given the threshold of 1.5 volts in combination with input and output resistors of 100 ohms, and further assuming that the resistance of amplifier 62 is such that the resistance of the above-discussed parallel combination is essentially equal to the resistance of the test circuit, then a resistance in the test circuit of about 70 ohms or greater will cause amplifier 62 to fire. In practice, the actual threshold voltage may vary, for example between 1.2 volts and 1.8 volts. Such deviation, however, does not interfere with the identification of open circuits in any material respect, since the nominal resistance of the circuits is substantially lower than that required to trigger amplifier 62, while the resistance of an open circuit is of course substantially higher. The output of all sensing circuits 54 is thus a digital word indicating the conditions of the test circuits. Amplifier 62 can be provided with a hysteresis (positive feedback) loop with a resistance if desired. This would result in cleaner switching output signals, but also would reduce sensitivity.

On occasion, it is desirable in the course of testing to configure sensing circuit 54 to provide a logic state indicating normal operation, in spite of the fact that the circuit under test is open or of a high resistance. This option is provided as NAND gate 74 receiving the output of differential amplifier 62, and with another input connected to high voltage terminal 56 through a resistor 76 of a high resistance, e.g. 10,000 ohms. A shunt 78 connects resistor 76 to ground through a switch 80 which normally is open.

With switch 80 open, a high input is provided to NAND gate 74. A high input to the NAND gate from amplifier 62 as well will generate a logic low output from NAND gate 74, indicating an error condition such as an open circuit. Of course, for a closed or short circuit the output of differential amplifier 62 is low and the output of NAND gate 74 is high, indicating the normal operating condition. If switch 80 is closed, a low logic state is provided as an input to NAND gate 74, resulting in a high or normal condition output regardless of the input received from the differential amplifier. In short, once an error condition is identified for a particular test circuit, switch 80 can be closed to override the error output. In the multiple circuit arrangement, switches 80 are provided in DIP form, each package having a row of switches.

Normally, the sensitivity of sensing circuit 54 to variations in test circuit resistance can be altered by changing the resistances of input and output resistors 60 and 70, for example increasing sensitivity to generate the error logic state at a lower resistance value by substituting input and output resistors with lower resistance values. An alternative approach is shown in FIG. 4, namely the addition of a resistor 82 between the output of the test circuit and common node 68. This has the effect of providing a voltage to the inversion input of differential amplifier 62 somewhat lower than the voltage at the output of the associated test circuit, having the practical effect of reducing the voltage threshold between the differential amplifier inputs.

As for decreasing the sensitivity of circuit 54, one approach of course would be to repace resistors 60 and 70 with resistors of a lower resistance value. The voltage at terminal 56 can be changed, or an amplifier with a different threshold can be employed.

Figure 6:
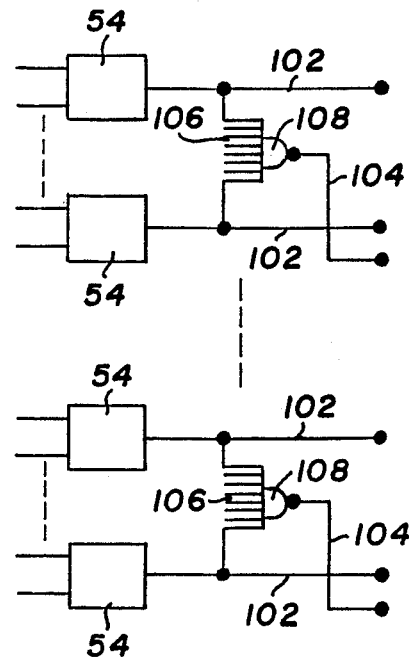
FIG. 6 is a schematic representation of alternative embodiment testing circuitry corresponding to the circuitry in FIG. 5, for use with an alternative test circuit configuration.

FIGS. 5 and 6 disclose alternative embodiments of the sensing and triggering circuitry on continuity sensing boards such as board 26. In FIG. 5, the continuity testing board circuitry includes 124 sensing circuits 54 and 124 data channels or signal paths 86, each connected to an associated one of the sensing circuits for providing the sensing circuit output to a logic analyzer. The sensing circuits are divided into four substantially identical sets of 31 sensing circuits each, one such set being shown. In addition to its data channel, each of the sensing circuits includes a triggering channel 88. The triggering channels provide the sensing circuit outputs to a series of NAND gates 90, 92, 94 and 96, each accepting up to eight triggering channels. When the logic state of all triggering channels to any one of the NAND gates is high, which corresponds to the associated test circuits being closed or the associated switches 80 being closed, then the output of the NAND will be the low voltage level logic state. Should any one of its inputs be low, the output of NAND gate 90 (for example) is the high logic state. The output of NAND gates 90-96 is provided to a NOR gate 98, the output of which is provided to a common triggering channel 100 for the first 31 sensing circuits.

If all of the inputs to NOR gate 98 are the low logic state, the NOR gate output is high. Conversely, if an error condition is sensed in any of the first 31 test circuits, the corresponding one of NAND gates 92-96 provides a high level logic state input to the NOR gate which in turn generates the low logic state as its output. Thus there are four common triggering channels 100, any one of which sends a triggering signal to the logic analyzer by shifting from the high to the low voltage logic state.

FIG. 6 shows alternative continuity sensing board circuitry accommodating 152 separate sensing circuits 54. Again, each sensing circuit 54 has its own associated data channel 102 for providing the sensing circuit output to the logic analyzer. In this case, however, the sensing circuits are segmented into nineteen substantially identical groups of eight for triggering purposes, the first and last of which are shown, such that there are 19 separate common triggering channels 104. Individual triggering channels 106 of eight sensing circuits are provided as inputs to a NAND gate 108, with the output of the NAND gate provided directly to the common triggering channel. Consequently, if all sensing circuit outputs are the high logic state corresponding to closed circuits or switches 80, the output of each NAND gate 108 is the low logic state. The NAND gate of course generates the high voltage logic state should any of its inputs be low, and thus the triggering signal for each of the 19 triggering channels 104 is a shift from the lower logic level to the high logic level.

Figure 7:
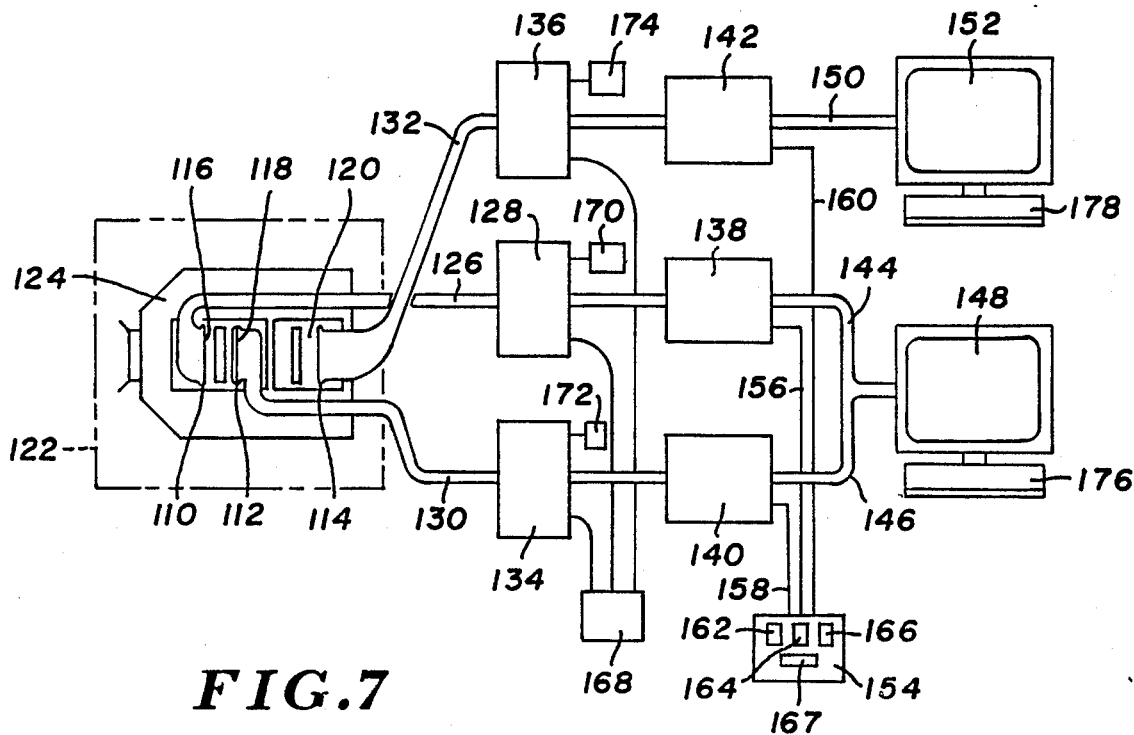
FIG. 7 is a diagrammatic view of an alternative embodiment testing apparatus for simultaneously testing three circuit configurations.

FIG. 7 shows a practical working embodiment in which three test assemblies or specimens, including a 4 inch by 6 inch printed circuit board 110 and two 6 inch by 9 inch printed circuit boards 112 and 114 along with semiconductor packages mounted on each, are tested simultaneously. While this system operates using TTL logic, it should be noted that ECL or CMOS logic could be employed as a substitute. PCB 112 is a "single-sided" printed circuit board assembly, while test board 114 is double-sided, having twice the number of test circuits. The printed circuit board assemblies are mounted to respective fixtures 116, 118 and 120, with the assemblies and fixtures housed within a test chamber 122 and supported on a vibrational table 124.

A twisted pair cable 126 connects the respective input and output terminals of the test circuits with their associated comparator inputs for each of the sensing circuits of continuity sensing board 128 configured as shown in FIG. 6. In a similar fashion, twisted pair cables 130 and 132 connect test assemblies 112 and 114 and continuity sensing boards 134 and 136, which are configured as shown in FIG. 5.

The output of each continuity sensing board, including the data channels and common triggering channels, is provided to a logic analyzer, in particular logic analyzers 138, 140 and 142 associated with continuity sensing boards 128, 134 and 136, respectively. In the arrangement shown, the logic analyzers are Model 2100U interactive state analyzers available from Northwest Instrument Systems, Inc. of Beaverton, Oreg. Each of the analyzers can receive up to 80 parallel channels of synchronous data, with each channel having a memory of up to 4,096 bits. Logic analyzers 138 and 140 are connected, and thus together handle the collective input provided by continuity sensing boards 128 and 134. Logic analyzer 142 is associated only with continuity sensing board 136.

Ribbon cables 144 and 146 connect a computer 148 to logic analyzers 138 and 140, while a ribbon cable 150 joins logic analyzer 142 and a computer 152. Computers 148 and 152 in this arrangement can be IBM AT personal computers or compatible computers. Each of computers 148 and 152 contains the software necessary for operating its associated logic analyzer or analyzers. The software enables each of logic analyzers 138-142 to store data only after receiving a storage command or triggering signal from its associated one of the continuity sensing boards.

An indicator panel 154 is connected to logic analyzers 138-142 respectively through lines 156, 158 and 160. Indicator panel 154 includes three light emitting diodes (LED's) 162, 164 and 166 triggered responsive to the sensing of error condition logic analyzers 138, 140 and 142 respectively. A button for resetting the indicator LED's is provided at 167.

A power supply 168 is connected to each of continuity sensing boards 128, 134 and 136, and biases the high voltage terminals 56 of the sensing circuits to a positive five volts or other predetermined high voltage level. A grounding terminal of the power supply also is connected to the sensing boards, in particular to the low voltage terminals 72 of the sensing circuits. Pulse generators at 170, 172 and 174 are incorporated into the circuitry of each of the sensing boards to control the rate at which the data channel and common triggering channel outputs are provided to the associated logic analyzers. A sampling frequency of 10,000,000 pulses per second (i.e. a 100 nanosecond interval between pulses) has been found desirable.

In the course of using the testing system, the operator first loads each printed circuit board assembly into its appropriate fixture, encloses the loaded fixtures within chamber 122, and selects the appropriate mode of testing, whether temperature cycling, vibration, or both. The operator then activates the power supply and other components through computers 148 and 152. At 100 nanosecond intervals, as controlled by pulse generators 170–174, the logic state at each of the sensing circuit outputs and each of the common triggering circuits, is provided to logic analyzers 138–142. However, as long as no open or abnormally highly resistive circuits are indicated, the logic analyzers do not store the data.

As soon as any of the circuits is identified as open or highly resistive, the appropriate triggering circuit delivers a changed logic level to its associated logic analyzer, and this change in logic state comprises a storage command or triggering signal, whereupon the logic analyzer begins storing data received in all of its channels. The appropriate one of LED's 162–166 is activated to indicate an error condition has been found, and the associated one of computers 148 and 152 displays on its video terminal the error condition. The data stored in the associated logic analyzer can be displayed by the operator if desired. When the memory channels of the logic analyzer are full, no further data can be stored on the logic analyzer. At this point, the operator has the option of utilizing backup storage, for example a disc drive associated with the corresponding computer, and to either continue the test without further adjustment or close the switch 80 associated with the identified circuit and continue testing. Override switches 80 thus provide the option of proceeding with the test to locate other open or highly resistant circuits, without a continual loading and unloading of the associated logic analyzer due solely to the particular circuit first indicating an error. Of course, if it is desired that the logic analyzer capacity represent a longer period of time, the sampling frequency can be reduced, for example to an interval of one microsecond between pulses. This is accomplished by changing the pulse rate of pulse generators.

Thus, the test apparatus is capable of identifying not only permanently open circuits, but circuits exhibiting intermittent open behavior under adverse temperature cycling or vibration. The record of the intermittent failure facilitates an analysis of why it occurred, since the permanent record of the failure, on a printout or the like, can be identified with a particular time during the temperature or vibration test cycle. Given the simultaneous testing of all channels and the short interval between test pulses, intermittent behavior on the order of a few hundred nanoseconds can be detected. Further, the simple and direct connection of the test circuit input and output in parallel with a differential amplifier, and the use of the differential amplifier output to generate one of two logic states as opposed to an analog response, provides a simple, rapid and reliable means for detecting open or highly resistive circuits.

What is claimed is:

1. A process for simultaneously testing a plurality of electrical circuits in a circuit configuration to detect an error condition with respect to one or more of the electrical test circuits, including the steps of:
   providing a plurality of electrical test circuits, each having a test circuit input and a test circuit output; and providing a plurality of comparator means, one associated with each test circuit, each comparator means including first and second comparator inputs;
   biasing each of said test circuit inputs and its associated one of said first comparator input to a first voltage level;
   generating a second voltage level corresponding to the voltage level at said test circuit output and less than said first voltage level, and providing said second voltage level to the associated one of said second comparator inputs;
   connecting each of said test circuit outputs and associated second comparator inputs to a low voltage terminal through a sensor resistor having a resistance substantially greater than a nominal resistance of its associated test circuit, and biasing said low voltage terminals to a third voltage level less than said second voltage;
   generating a comparator output for each comparator comprising a first logic state whenever the voltage at the first comparator input exceeds the voltage at the second comparator input by a prerdetermined thershold level, and further comprising a second logic state whenever the voltage at the first comparator input does not exceed the voltage at the second comparator input by at least the predetermined threshold; and
   simultaneously sensing the logic state outputs of the comparator means.

2. The process of claim 1 further including the steps of:
   designating, in connection with each of said comparator means, one of said alternative logic output states as a normal condition and the other of said state outputs as an error condition; and
   storing said logic outputs of said comparator means responsive to sensing said error condition at one or more of said comparator means outputs.

3. An apparatus for simultaneously testing a plurality of electrical circuits in a circuit configuration to depict an error condition with respect to one or more of the tested circuits, said apparatus including:
   a plurality of sensing circuits, each sensing circuit associated with one of a plurality of test circuits with each test circuit including a test circuit input and a test circuit output; each sensing circuit comprising:
     a comparator means having first and second comparator inputs and a predetermined threshold voltage between said first comparator input and said second comparator input;
     an input voltage means for providing a first voltage level to said first comparator input and to the test circuit input of the associated test circuit;
     an output voltage means connected to the test circuit output of the associated test circuit and to the second comparator input for providing a second voltage level to said second comparator input, less than said first voltage and corresponding to the voltage at the test circuit output; and
   a low voltage terminal and a sensor output resistor connected to the low voltage terminal and to said output voltage means, said sensing resistor having a resistance substantially greater than a nominal resistance of the associated test circuit;
   wherein each of said comparator means generates a comparator output comprising first and second alternative logic states, said first state being generated whenever said first voltage exceeds the second voltage by at least said predetermined threshold and said second state being generated whenever said first voltage does not exceed the second voltage by at least the predetermined threshold; and wherein one of said first and second logic states indicates a normal condition with respect to the associated test circuit, the other of said states indicating an error condition with respect to the associated test circuit;

a digital sensing means for simultaneously sensing the comparator outputs of said comparator means as a digital word representing the conditions of the test circuits, and a control means for generating a storage command signal responsive to the sensing of an error condition at any of said comparator outputs; and a storage means including a plurality of channels, one channel associated with each of said sensing circuits, for storing the comparator outputs of said comparator means responsive to receiving said storage command signal.

4. The apparatus of claim 3 further including:

an indicator means for generating a user recognizable indication responsive to the generation of said storage command signal.

5. The apparatus of claim 4 further including:

a display means for providing a visual display of the comparator outputs stored in said storage means.

6. The apparatus of claim 4 further including:

a recording means for generating a permanent user readable record of the comparator means outputs stored in said storage means.

7. The apparatus of claim 3 wherein:

said input voltage means of each sensing circuit comprises a high voltage terminal, a power supply means for biasing the high voltage terminal to a predetermined high voltage, a first common terminal connecting the first comparator input and the test circuit input, and a sensor input resistor connected between the high voltage terminal and the first common terminal.

8. The apparatus of claim 7 wherein:

said output voltage means comprises a second common node connecting the second comparator input and the test circuit output, and said sensor output resistor is connected between said second common node and said sensor output terminal, said sensor output terminal being maintained at ground.

9. The apparatus of claim 3 wherein:

said digital sensing means includes a pulse generator for simultaneously providing pulses at predetermined time intervals to said sensing circuits.

10. The apparatus of claim 3 wherein:

each of said sensing circuits includes an override means for causing the associated comparator means to generate a selected one of the first and second logic states as the comparator output.

11. The apparatus of claim 10 wherein:

said comparator means comprises a differential amplifier and a NAND circuit receiving the output of the differential amplifier, and wherein said override means includes a steady-state voltage input to said NAND circuit comprising a selected one of said logic states, and a switching means which, when closed, shunts said steady-state voltage away from said NAND circuit.

12. The apparatus of claim 3 wherein:

said control means includes a triggering circuit for receiving said comparator means outputs as trigger inputs, and for generating a triggering circuit output comprising said storage command signal whenever at least one of said comparator means outputs indicates said error condition.

13. The apparatus of claim 12 wherein:

said triggering circuit includes a plurality of NAND circuits, each NAND circuit receiving the comparator means outputs of one of a plurality of subsets of said comparator means.

14. The apparatus of claim 13 wherein:

said triggering circuit further includes a plurality of NOR logic gates, each of said NOR gates receiving the outputs of a plurality of said NAND logic gates and adapted to generate said storage command signal as its output.

15. The apparatus of claim 3 further including:

an environmental control means for subjecting said test circuit configuration to predetermined environmental conditions as said circuits are tested.

16. The apparatus of claim 15 wherein:

said environmental control means includes means forming a chamber enclosing said circuit configuration and a means for controlling the temperature inside said chamber.

17. The apparatus of claim 16 wherein:

said environmental control means further includes a vibrational fixture for releasably holding said circuit configuration.

18. The apparatus of claim 3 wherein:

the resistance of said sensor output resistor is at least ten times the nominal resistance of the test circuit.

19. The apparatus of claim 7 wherein:

the resistance of said sensor input resistor and said sensor output resistor are substantially equal to one another, each being at least ten times the nominal resistance of the test circuit.

20. The apparatus of claim 3 wherein:

said first logic state in each sensing circuit indicates an error condition with respect to its associated one of said test circuits, and corresponds to the test circuit being open or exhibiting an unacceptably high resistance.

* * * * *